United States Patent [19]

Martin, III

[11] Patent Number: 4,528,696

[45] Date of Patent: Jul. 9, 1985

[54] ARRANGEMENT FOR PROVIDING SIGNALLING TONES AND VOLUME CONTROL SIGNALS

[75] Inventor: Robert J. Martin, III, Lynchburg, Va.

[73] Assignee: General Electric Company, Lynchburg, Va.

[21] Appl. No.: 488,267

[22] Filed: Apr. 25, 1983

[51] Int. Cl.³ .............................................. H04B 1/38
[52] U.S. Cl. ...................... 455/73; 455/355; 179/2 EA
[58] Field of Search .................. 455/73, 77, 78, 79, 455/186, 355; 179/2 EA; 370/32; 381/107

[56] References Cited

U.S. PATENT DOCUMENTS

| 4,065,755 | 12/1977 | Oliveira. | |
|---|---|---|---|
| 4,101,871 | 7/1978 | Oliveira. | |
| 4,145,655 | 3/1979 | Caudel et al. | 455/73 |
| 4,168,399 | 9/1979 | D'Amico et al. | |
| 4,179,588 | 12/1979 | Oliveira | 179/2 EA |
| 4,223,352 | 9/1980 | Belisomi | 455/186 |

FOREIGN PATENT DOCUMENTS 38580 10/1981 European Pat. Off. ............ 455/78

Primary Examiner—Jin F. Ng
Attorney, Agent, or Firm—James J. Williams; Robert C. Lampe, Jr.

[57] ABSTRACT

A keyboard with number and volume control pushbuttons is provided with a microcomputer, a digital-to-analog converter, and an output circuit to provide signalling tones to a radio transmitter in response to operation of the number pushbuttons, and to provide volume control signals to a radio receiver in response to operation of the volume control pushbuttons.

7 Claims, 1 Drawing Figure

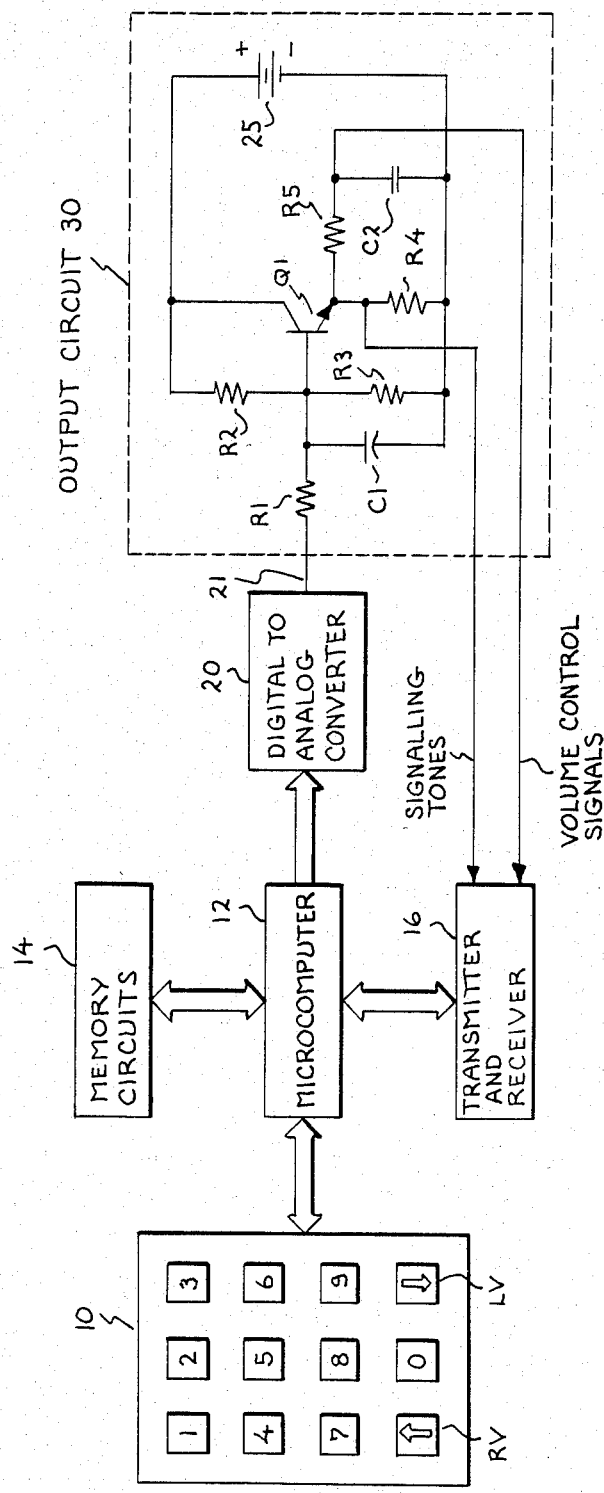

ARRANGEMENT FOR PROVIDING SIGNALLING TONES AND VOLUME CONTROL SIGNALS

BACKGROUND OF THE INVENTION

My invention relates to an arrangement for providing signalling tones and volume control signals, and particularly to such an arrangement for use with a radio transceiver.

Radio communication equipment is presently required to provide more functions, but at the same time required to be smaller and more compact. For example, a handheld radio transceiver or a handset for a mobile or station transceiver may have to permit a user to send signalling tones and also control the receiver volume. Hence, there is a definite need for communications equipment that provides various functions, that is small and light, and that is as inexpensive as possible.

SUMMARY OF THE INVENTION

My invention provides an improved arrangement for producing signalling tones to be used in a radio transmitter, and for providing volume control signals to control the volume of a radio receiver. Such a radio transmitter and receiver (or transceiver) usually already has a keyboard, either on the transceiver itself if the transceiver is of the handheld or personal type, or on a control device, such as a telephone handset or control unit, if the transceiver is of the mobile or base station type. Such a transceiver usually already has a microcomputer and memory circuits, which may have unused capability. In accordance with my invention, I provide a digital-to-analog converter and an output circuit which, in cooperation with the keyboard and microcomputer, produce a plurality of signalling tones for the radio transmitter, and which produces up and down volume control signals for the radio receiver. The microcomputer senses when the transmitter is operated, and in response to operation of the pushbuttons or keys on the keyboard, produces digital signals that are converted to signalling tones. These tones are usually used to indicate a particular telephone number being called. The microcomputer also senses when the radio receiver is operated, and in response to operation of volume up or volume down pushbuttons or keys on the keyboard, produces digital signals that are converted to analog volume control signals. These analog volume control signals control the receiver volume. Both the signalling tones and the volume control signals are produced by my common digital-to-analog converter and output circuit, thereby providing a small, light, and relatively inexpensive arrangement for producing both signalling tones and volume control signals.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which the single FIGURE shows a schematic diagram of a preferred embodiment of the arrangement in accordance with my invention.

DESCRIPTION OF THE PREFERRED EMBODIMENT

Although I have not indicated the location of the elements forming the single FIGURE, it is to be understood that the elements forming my invention may all be located on or in the case of a handheld or portable radio; or some elements may be located on a control panel and other elements may be located in a remote or separate location in the case of a mobile or base station radio.

As is typical of present radio transceivers, a keyboard (or sometimes called a keypad) 10 is provided for a user or operator to control his radio. In the case of radio telephones, the keyboard 10 may include 10 (or more) keys or pushbuttons labeled 1 through 0, and additional pushbuttons for any other desired purpose or function. These numbered pushbuttons are used to provide selected coding signals which, when converted to the dual tone, multifrequency (DTMF) type, provide dialing or signalling information over a radio transmitter to a distant receiver so as to call a certain telephone or other radio. In addition, the keyboard 10 is provided with a raise volume pushbutton RV and a lower volume pushbutton LV for controlling the output volume of the user's radio receiver. The keyboard 10 is connected over a plurality of lines to a microcomputer 12 which provides the control and other functions. The microcomputer 12 is provided with a plurality of memory circuits 14, some of which may be read only memories (ROM) and some of which may be random access memories (RAM). The microcomputer 12 is also connected over lines to the radio transmitter and receiver 16. The circuit as described thus far is known in the art, and enables a user, with the keyboard 10, the microcomputer 12, and the memory circuits 14 to control the operations and functions of the radio transmitter and receiver 16. In the circuit as described thus far, I have shown the connections between these elements 10, 12, 14 and 16 by lines which carry signals in both directions, as known in the art.

In accordance with my invention, I provide a digital-to-analog converter 20. As known in the art, the converter 20 produces analog signals from the digital signals provided by the microcomputer 12. These analog signals are selected tones or frequencies for signalling, or are selected waveforms that increase or decrease receiver volume. The converter 20 may also be supplied with digital signals to provide additional or different functions. The converter 20 converts the digital signals supplied by the microcomputer 12 to analog signals at an output 21. This output 21 is connected to an output circuit 30 (enclosed in dashed lines) through a resistor R1. My circuit 30 is provided with a suitable source of direct current voltage 25. The resistor R1 is connected to the base of an NPN transistor Q1 whose collector is connected to the positive terminal of the source 25. A suitable biasing voltage is provided by the resistors R2, R3. The resistor R3 is shunted by a capacitor C1 that provides low pass filtering to remove harmonics of the signalling tones. The emitter of the transistor Q1 is connected through a resistor R4 to the negative terminal of the source 25.

The signalling tones are derived directly from the emitter of the transistor Q1 and supplied to the radio transmitter. Volume control output signals are derived from the transistor Q1 through a low pass filter circuit comprised of a resistor R5 and a capacitor C2 for the purpose of preventing signalling tones, with their relatively high frequencies, from affecting the setting of the volume control during transmission of the signalling tones.

In the operation of my circuit, I first assume that the user has placed his radio equipment in the transmitting condition. In this condition, the radio transmitter supplies a signal that causes the microcomputer 12 to be receptive to coding signals from the keyboard 10. As the user operates the numbered keys or pushbuttons of the keyboard 10, each operation causes the microcomputer 12 to look into the memory circuits 14 to determine the significance of the operation of a particular numerical key. The memory circuits 14 provide appropriate information to the microcomputer 12 which generates an appropriate digital signal indicative of the tone or frequency (or tones or frequencies) indicated by each respective numerical key or pushbutton. These digital signals are applied to the digital-to-analog converter 20 which converts the digital signals into corresponding analog signals that are applied to the transistor Q1. The analog signals forming the signalling tones are derived from the emitter of the transistor Q1 and applied to the radio transmitter which transmits these signals for the intended signalling purposes. These signalling tones are also supplied to the filter circuit R5, C2 which filters the signals. Any of the lower frequency signals which are passed by the filter circuit are supplied to the radio receiver, but have no effect since the radio receiver is not being operated.

When the user operates his radio receiver, the microcomputer 12 is then arranged to be responsive to signals from the raise volume and lower volume keys RV, LV of the keyboard 10. These signals are applied to the microcomputer 12 which utilizes the memory circuits 14 to produce digital signals indicative of a raise volume signal or a lower volume signal. In this regard, such raise and lower volume signals may, after being converted to an analog signal, be linear slope functions of relatively low frequency. These signals are supplied by the transistor Q1 to the filter circuit R5, C2 which passes the raise or lower volume signals to the radio receiver to cause the radio receiver volume to be adjusted accordingly. Such adjustment can be in the form of an electronic attenuator or other similar device.

It will thus be seen that I have provided a new and improved arrangement for use with existing control apparatus for permitting a single digital-to-analog converter and output circuit to produce two types of signals, in this case signalling tones or volume control signals. While I have shown only one embodiment of my invention, persons skilled in the art will appreciate the modifications that may be made. For example, other control functions may be substituted for the signalling tones and/or the volume control signals. And further control functions may be provided by suitable filtering or other isolation outputs from the transistor Q1. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An arrangement for providing signalling tones to a radio transmitter and volume control signals to a radio receiver, comprising:
   a. a keyboard having signalling tone pushbuttons and volume control pushbuttons;
   b. means coupled to said keyboard for producing signalling tones in response to operation of said radio transmitter and said signalling tone pushbuttons, and for producing volume control signals in response to operation of said radio receiver and said volume control pushbuttons;
   c. and an output circuit coupled to said producing means for supplying signalling tones to said radio transmitter and for supplying volume control signals to said radio receiver.

2. The arrangement of claim 1 wherein said producing means comprise a digital-to-analog converter.

3. The arrangement of claim 2 wherein said output circuit supplies said signalling tones at a first output, and wherein said output circuit includes a low pass filter for supplying said volume control signals at a second output.

4. The arrangement of claim 2 wherein said producing means further comprises a microcomputer and memory circuits.

5. The arrangement of claim 4 wherein said output circuit supplies said signalling tones at a first output, and wherein said output circuit includes a low pass filter for supplying said volume control signals at a second output.

6. The arrangement of claim 1 wherein said output circuit supplies said signalling tones at a first output, and wherein said output circuit includes a low pass filter for supplying said volume control signals at a second output.

7. A control arrangement for a radio transceiver having a transmitter portion and a receiver portion, comprising:
   a. a keyboard having numerical pushbuttons and volume control pushbuttons;
   b. a computing device and memory coupled in operative relationship to said keyboard for producing tone indicative digital signals when the transmitter portion is being operated, and for producing volume indicative digital signals when the receiver portion is being operated;
   c. a digital-to-analog converter coupled to said computing device for converting said tone indicative digital signals and said volume indicative digital signals to corresponding analog signals;
   d. an output circuit coupled to said digital-to-analog converter and having first and second outputs;
   e. means for coupling said first output to said transmitter portion;
   f. and low pass filter means coupling said second output to said receiver portion.

* * * * *